(12) United States Patent
Tauchi et al.

(10) Patent No.: US 6,727,423 B2
(45) Date of Patent: Apr. 27, 2004

(54) THERMOELECTRIC MODULE AND PROCESS FOR PRODUCING THERMOELECTRIC MODULE

(75) Inventors: Hitoshi Tauchi, Anjo (JP); Masato Itakura, Toyota (JP); Hirotsugu Sugiura, Hekinan (JP)

(73) Assignee: Aisin Seiki Kabushiki Kaisha, Kariya (JP)

( * ) Notice: Subject to any disclaimer, the term of this patent is extended or adjusted under 35 U.S.C. 154(b) by 0 days.

(21) Appl. No.: 09/964,371

(22) Filed: Sep. 28, 2001

(65) Prior Publication Data

US 2002/0059951 A1 May 23, 2002

(30) Foreign Application Priority Data

Sep. 29, 2000 (JP) ......................................... 2000-300017

(51) Int. Cl.[7] .......................... H01L 35/34; H01L 35/28; H01L 35/08; H01L 23/06; F25B 21/02
(52) U.S. Cl. ................. 136/201; 136/203; 136/205; 136/237; 252/62.3 T; 62/3.3; 62/3.6; 257/930; 257/684
(58) Field of Search ................. 136/200, 201, 136/203, 230, 237; 252/62.3 T; 62/3.2, 3.3, 3.6, 3.7; 257/930, 678, 684, 712, 718–722

(56) References Cited

U.S. PATENT DOCUMENTS 4,518,112 A * 5/1985 Miller et al. ............. 228/124.1
5,441,576 A * 8/1995 Bierschenk et al. ......... 136/203
5,924,290 A * 7/1999 Yoshino ....................... 62/3.7

FOREIGN PATENT DOCUMENTS

JP  10-62659  3/1998

OTHER PUBLICATIONS

Translation of "Thermoelectric Transfer System Technical General Handbook", Realize Company, Jun. 30, 1995.

* cited by examiner

*Primary Examiner*—Patrick Ryan
*Assistant Examiner*—Thomas H Parsons
(74) *Attorney, Agent, or Firm*—Oblon, Spivak, McClelland, Maier & Neustadt, P.C.

(57) ABSTRACT

A thermoelectric module includes a case, a insulating base plate for a exoergic side, a insulating base plate for endoergic side, a first soldering layer which joins the insulating base plate for the exoergic side to the case via a first soldering material, and a second soldering layer which joins P-type and N-type semiconductor tips to the insulating base plate for an exoenergic side and a insulating base plate for an endoergic side, using second soldering material. The melting point temperature of the first soldering material for the first soldering layer is higher than the melting point temperature of the second material for the second soldering layer.

4 Claims, 1 Drawing Sheet

THERMOELECTRIC MODULE AND PROCESS FOR PRODUCING THERMOELECTRIC MODULE

CROSS REFERENCE TO RELATED APPLICATIONS

The present application is based on Japanese patent application 2000-300017 filed on Sep. 29, 2000, which is hereby incorporated herein by reference, in its entirety.

BACKGROUND OF THE INVENTION

1. Field of the Invention

The present invention relates to a thermoelectric module which may be an optical communication semiconductor laser diode module, a semiconductor amplifier module, an external electro-absorption modulator, a reception module, etc.

2. Discussion of the Background

The environmental setting of a thermoelectric semiconductor laser diode module, in other words the external ambiance of the laser diode module, can approach a temperature of 60° to 70° C. due to the generation of joule heat in the various electric parts. In a laser diode used as a light source in high speed optical fiber communication, when the ambient temperature changes, the optical characteristics also change, so that the wavelength of the laser diode changes. Therefore, a tip-carrier equipped with a laser diode is isolated thematically from the module case. In order to thermally isolate the laser diode and keep its temperature constant, a thermoelectric module having a controlled temperature is used in general.

The thermoelectric module with controlled temperature is made by joining the insulating body enclosing the electrodes and the semiconductor tips. When heating or cooling by using the thermoelectric module, the construction is joined to another member via further soldering material, such as shown in Japanese laid open publication patent tokkai-hei 10-62659.

For example, in the case of using the thermoelectric module for cooling, the soldering material used for joining the thermoelectric module to the physical object to be cooled or the construction body for exoergio (a heat sink or a box case etc.), has a lower melting point temperature (solidus, liquidus) than the soldering material joined the tips between the two insulations. The reason is to prevent deformation and destruction of the thermoelectric module when joining. Selection of soldering material is decided while making an allowance of a safety ratio in regard to the generation of over-shoot of the temperature of the heat process.

Furthermore, in the case where high heat resistance is required, as disclosed in pages 24 to 25 of *"Thermoelectric Transfer System Technical General Handbook"* published by Realize Company, published Jun. 30, 1995, in general 95Sn5Sb solder is used because when the semiconductor tips are joined the heat resistance of the semiconductor adds to the heat resistance of soldering material.

However, as above-mentioned, the joining of the encasing body and the construction for heat release uses a soldering material having a lower melting point temperature (solidus, liquidus) than the soldering material joining the semiconductor tips. Therefore, when high heat resistance is required, there is the problem that the heat resistance and the reliability of the joint of the insulating body and the construction for heat release deteriorates.

Furthermore, in regard to using 95Sn5Sb solder for joining tips, when we select soldering material for joining the insulating body for exoergic side (heat release side) to the semiconductor tips and we select solder material having a high heat resistance with a lower melting point than 95Sn5Sb solder, there is the problem that most soldering material includes Pb having an adverse environmental effect.

SUMMARY OF THE INVENTION

It is an object of the present invention to solve the above-mentioned disadvantages.

According to one feature of the present invention, a thermoelectric module comprises a case, P-type and N-type semiconductor tips having an exoergic side and an endoergic side, said P-type and N-type semiconductor tips being positioned in said case, an insulating base plate for the exoergic side positioned in said case, an insulating base plate for the endoergic side positioned in said case, a first soldering layer which joins the insulating base plate for the exoergic side to said case via first soldering material, and second soldering layers which respectively join the P-type and N-type semiconductor tips to the insulating base plate for the exoergic side and the insulating base plate for the endoergic side using a second soldering material, wherein a melting point temperature of first soldering material for the first soldering layer is higher than a melting point temperature of the second material for the second soldering layers.

Therefore, the thermoelectric module according to the present invention can have high heat resistance for the soldering material at the exoergic side, even though solder such as 95Sn5Sb solder is used.

According to another feature of the present invention, a process for producing a thermoelectric module including P-type and N-type semiconductor tips having an exoergic side and an endoergic side, comprises a first step of joining a case to an insulating base plate via a first soldering layer of a first soldering material, a second step of joining an insulating base plate for the endoergic side to the P-type and N-type semiconductor tips via a second soldering layer of a second soldering material, and third step of joining an insulating base plate for the exoergic side to the P-type and N-type semiconductor tips via a second soldering layer of the second soldering material, wherein a melting point temperature of first soldering material for the first soldering layer is higher than the melting point temperature of second material for the second soldering layers.

Therefore, the thermoelectric module can be prevented from deformation and destruction.

Furthermore, according to the present invention, the semiconductor tips do not produce heat when joining the insulating base plate for the exoergic side, so that we can use soldering material which needs heat more than 300° C., that could not be used heretofore in relation with heat resistance of the tips at soldering. Furthermore, we need not use solder material comprising Pb.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
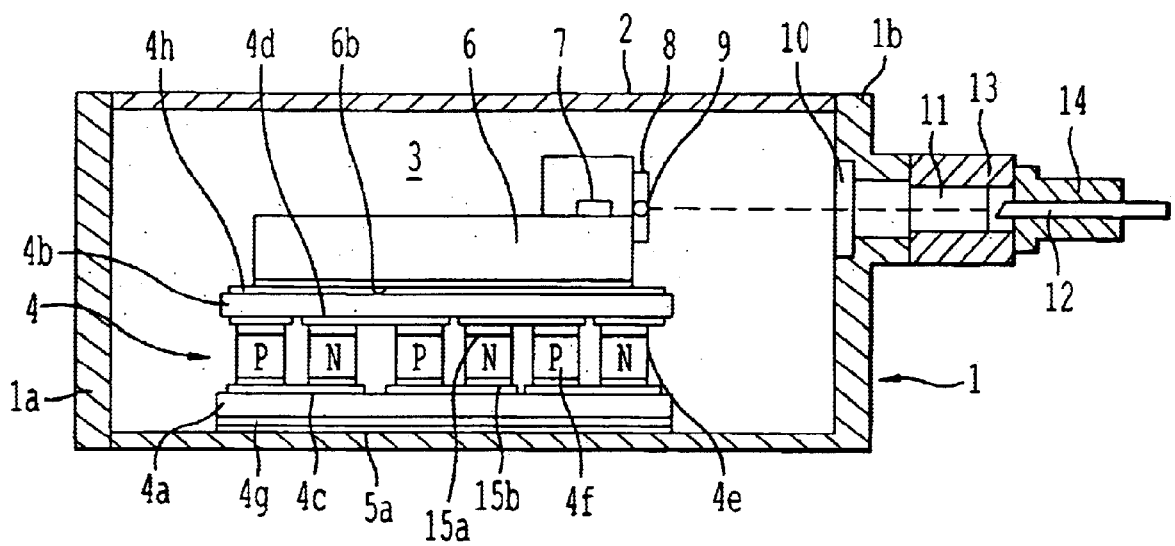
FIG. 1 shows a schematic cross sectional view of a thermoelectric module according to an embodiment of the present invention.

Referring now to the drawings, wherein like reference numerals designate identical or corresponding parts throughout the several views.

According to a first aspect of the invention, a module comprises an insulating base plate for an exoergic side, an insulating base plate for a endoergic side, a first soldering layer which joins the insulating base plate for the exoergic side to a case with first soldering material, and a second soldering layer which joins P-type and N-type semiconductor tips to the insulating base plate for an exoergic side and a insulating base plate for an endoergic side with second soldering material, wherein the melting point temperature of first soldering material for the first soldering layer is higher than the melting point temperature of second material for the second soldering layer.

According to a second aspect of the invention, a process for producing a thermoelectric module including P-type and N-type semiconductor tips having an exoergic side and an endoergic side, comprises a first step of joining a case to an insulating base plate via a first soldering layer of a first soldering material, a second step of joining an insulating base plate for the endoergic side to the P-type and N-type semiconductor tips via a second soldering layer of a second soldering material, and third step of joining an insulating base plate for the exoergic side to the P-type and N-type semiconductor tips via a second soldering layer of the second soldering material, wherein a melting point temperature of first soldering material for the first soldering layer is higher than the melting point temperature of second material for the second soldering layers.

According to a third aspect of the invention, the first soldering material is selected from at least one of 80Au20Sn, 80Au20Sb, 85Au12Ge, 60Au12Ge, 60Au20Ag20Sn, 75Au25Sb, 60Zn20Ge20Al, 96.4Au3.6Si, 95Zn5Al.

A preferred embodiment of the present invention will be described hereinafter in detail with reference to the accompanying drawings.

The semiconductor laser module according to the present invention has an airtight package 3 composed of a box case 1 and a cover 2 covering the case 1 as shown in FIG. 1. The inside of the package 3 is filled with dried nitrogen gas. composed of peltier elements in order to control the thermoelectric temperature, is joined to the inside of a bottom wall 1a of the case 1 via a first soldering layer 5a (the soldering layer joins the case and the insulating base plate for the exoergic side) through the intermediary of a second lower diode 4g.

In the thermoelectric module 4, a first lower diode 4c and a second upper diode 4d are formed on the surface of the insulating base plate 4a for the exoergic side and the insulating base plate 4b for the endoergic side, respectively. The pair of insulating base plates 4a and 4b face each other and are composed of $Al_2O_3$ or AlN.

The plural N-type semiconductor tips 4e and the plural P-type semiconductor tips 4f are connected directly and electrically in sequence of N, P, N, P with the first lower diode 4c and the second upper diode 4d. Furthermore, the ends of the N-type semiconductor tips 4e and the plural P-type semiconductor tips 4f are connected with lead wires, not shown.

Further, the first lower diode 4c and the second lower diode 4g are respectively formed on the upper surface and the lower surface of the insulating base plate 4a for the exoergic side. The first upper diode 4h and the second upper diode 4d are respectively formed on the upper surface and the lower surface of the insulating base plate 4a for the endoergic side.

A tipcarrier 6 is joined via a third soldering layer 6b (the soldering layer joined with the tipcarrier and the insulating base plate for the endoergic side) onto the surface of the thermoelectric module 4 through the first upper diode 4h.

A laser-diode 7 is placed on the surface of the tip-carrier 6, and a ball lens 9, held via the ball lens holder 8, is placed in the neighborhood of the laser diode 7.

An optical fiber 12 and a rod lens 11 are placed on another sidewall 1b of the case 1. The rod lens 11 is held by a rod lens holder 13, and the optical fiber 12 is held by the optical fiber holder 14. Further, fins for heat dissipation are placed on the outer bottom surface the case 1.

According to this embodiment, the case 1 as shown in FIG. 1 is composed of a ferro-ni-co series, Fe54%—Ni29%—Co17% alloy, or Fe58%—Ni42% alloy. The thermoelectric module 4 is held inside of the case 1 by soldering.

Furthermore, the second soldering layer 15a formed between the insulating base plate 4b for the endoergic side and the N-type and P-type semiconductor tips 4f, 4e, whereas the second soldering layer 15b for the exoergic side is formed between the insulating base plate 4a and the N-type and P-type semiconductor tips 4f, 4e.

The box case 1 and the insulating base plate 4a for the exoergic side are joined via the first soldering layer 5a composed of a first soldering material.

P-type semiconductor tips 4f and N-type semiconductor tips 4e are joined with the second soldering layer 15b for the exoergic side and the second soldering layer 15a for the endoergic side. The second soldering material is composed of 95Sn5Sb (melting point 232° C.: solidus).

Figure 2:
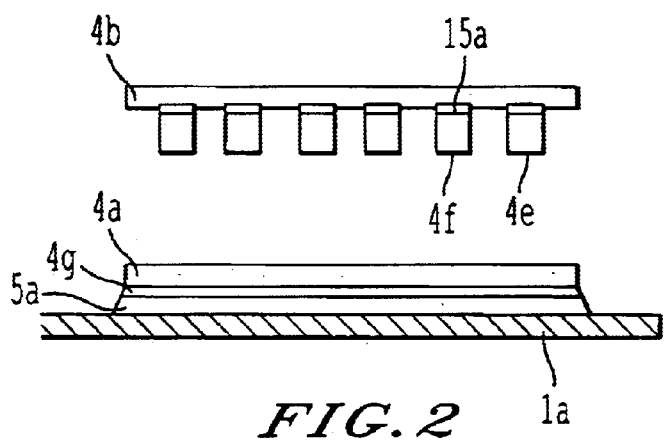
FIG. 2 shows a schematic cross sectional view of first and second steps of processing a thermoelectric module according to the embodiment of the present invention.
Figure 3:
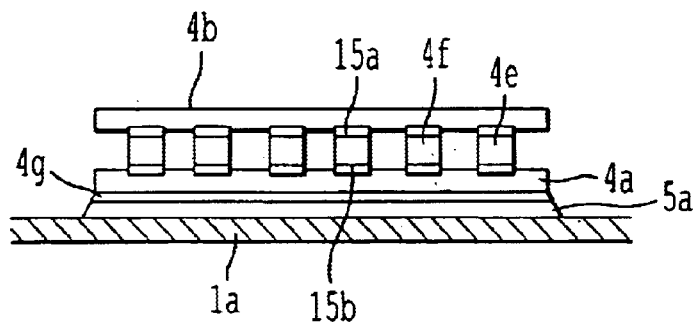
FIG. 3 shows a schematic cross sectional view of a third step of processing a thermoelectric module according to the embodiment of the present invention.

Secondly, a process for producing the thermoelectric module according to the present invention is shown in FIG. 2 and FIG. 3.

As shown in FIG. 2, a first soldering material, 80Au20Sn, (melting point 280° C.) is used for the material joined between the lower wall 1a and the insulating base material 4a.

Further, the ambient temperature is increased to a constant temperature of 320° C. and then a first soldering layer 5a is formed between the case 1 and the insulating base plate 4a for the exoergic side with the first soldering material.

In the next step, a second soldering material, 95Sn5Sb (melting point 232° C.: solidus) is used for soldering the insulating base plate 4b for the endoergic side, and the P-type and N-type semiconductor tips 4f, 4e. Further, the ambient temperature is increases to a constant temperature of 280° C., and then the case 1 and the insulating base plate 4b for the endoergic side are joined via the second soldering layer 15a composed of the second soldering material.

As shown in FIG. 3, the member assembled by the above-mentioned process is lowered, and then the P-type and N-type semiconductor tips of 4f, 4e and the insulating base plate 4a are joined via the second soldering layer 15b composed of the second material.

Further, the melting point temperature of the first soldering material for the first soldering layer 5a is higher than that of the second material for second soldering layer 15a.

The first soldering material is preferably 80Au20Sn, but may instead be at least one from 80Au20Sn, 80Au20Sb, 85Au12Ge, 60Au12Ge, 60Au20Ag20Sn, 75Au25Sb, 60Zn20Ge20Al, 96.4Au3.6Si, 95Zn5Al, which have higher melting points than the second material for the second soldering layer. The numeral of the composition ratio above-mentioned indicates wt % (weight %).

Embodiment Example 1

We explain the example of Embodiment 1 according to the present invention.

FIG. 1 shows a schematic cross sectional view of a thermoelectric module for a semiconductor diode laser according to the embodiment of the present invention.

As shown in FIG. 2 and FIG. 3, the process for producing the thermoelectric module according to the present invention is explained as follows.

The insulating base plate 4b for the endoergic side and the P-type and N-type semiconductors 4f, 4e are joined by the second solder layer 15a composed of the second material. The diodes are placed previously on the surface of the insulating base plate 4b by coating.

Further, the insulating base plate 4b for the endoergic side joined the semiconductor tips 4f, 4e, and the insulating base plate 4a, are joined by a soldering material compound composed of 95Sn5Sb.

The insulating base plate 4b and the carrier 6 are joined by soldering material composed of 58Bi42Sn, so that the thermoelectric module has no ingredient of Pb.

Heat resistance was examined by electrically energizing the thermoelectric module so that the temperature of the insulating base plate 4a for the exoergic side rose to the temperature shown in Table 1. In Table 1, the symbol "O" indicates that the solder did not remelt, whereas the symbol "X" indicates remelting of the solder.

We checked for remelting of the soldering material at the joining part of the case 1 and the insulating base plate 4a for exoergic side, and joining part of the semiconductor tips 4f, 4e and the insulating base plate 4a for exoergic side. No remelting was found.

Comparative Example 1

Process for producing thermoelectric module according to the Comparative Example 1 is explained as follows.

The joining of the semiconductor tips 4f, 4e and the insulating base plate 4b for the endoergic side was joined with 95Sn5Sb soldering material by the conventional process. In the next step, the joining of the insulating base plate 4a for the exoergic side and case 1 was done by soldering with 37Pb63Sn soldering material. The other steps and constituents are the same as in Embodiment Example 1.

The Comparative Example 1 was examined under the same conditions as in Embodiment Example 1.

There was the conditional constraint that the soldering material must make allowance for a safe ratio in consideration of attributes of 95Sn5Sb soldering material melting point (liquidus 240° C., solidus 232° C.). Therefore, as shown in Table 1, regarding the Comparative Example 1, soldering material of the joining part joined with the insulating base plate and the case was remelted when the temperature of the insulating base plate for the exoergic side rose to 200° C.

On the other hand, regarding Example 1, we can use soldering material having higher heat resistance than 95Sn5Sb soldering material. Therefore, the thermoelectric module according to Example 1 can have heat resistance for temperatures of more than 200° C. Further, the thermoelectric module does not have Pb, which has an adverse environmental effect.

Obviously, numerous modifications and variations of the present invention are possible in light of the above teachings. It is therefore to be understood that within the scope of the appended claims, the invention may be practiced otherwise than as specifically described herein.

TABLE 1

| | TEMPERATURE OF INSULATING BASE PLATE FOR EXOERGIC SIDE | 100° C. | 150° C. | 200° C. |
|---|---|---|---|---|
| EMBODIMENT EXAMPLE 1 | Joining part of semiconductor tips | O | O | O |
| | Joining part of insulating base plate for exoergic side | O | O | O |
| COMPARATIVE EXAMPLE 1 | Joining part of semiconductor tips | O | O | O |
| | Joining part of insulating base plate for exoergic side | O | O | X |

What is claimed is:

1. A thermoelectric module comprising:

a case,

P-type and N-type semiconductor tips having an exoergic side and an endoergic side, said P-type and N-type semiconductor tips being positioned in said case, an insulating base plate for the exoergic side positioned in said case, an insulating base plate for the endoergic side positioned in said case, a first soldering layer which joins the insulating base plate for the exoergic side to said case via first soldering material, and second soldering layers which respectively join the P-type and N-type semiconductor tips to the insulating base plate for the exoergic side and the insulating base plate for the endoergic side using a second soldering material, wherein a melting point temperature of first soldering material for the first soldering layer is higher than a melting point temperature of the second material for the second soldering layers.

2. A process for producing a thermoelectric module including P-type and N-type semiconductor tips having an exoergic side and an endoergic side, comprising:

a first step of joining a case to an insulating base plate via a first soldering layer of a first soldering material, a second step of joining an insulating base plate for the endoergic side to the P-type and N-type semiconductor tips via a second soldering layer of a second soldering material, and third step of joining an insulating base plate for the exoergic side to the P-type and N-type semiconductor tips via a second soldering layer of the second soldering material, wherein a melting point temperature of first soldering material for the first soldering layer is higher than the melting point temperature of second material for the second soldering layers.

3. A thermoelectric module according to claim 1:

wherein first soldering material is at least one selected from the group consisting of 80Au20Sn, 80Au20Sb, 85Au12Ge, 60Au12Ge, 60Au20Ag20Sn, 75Au25Sb, 60Zn20Ge20Al, 96.4Au3.6Sl and 95An5A1.

4. Process for producing thermoelectric module according to claim 2:
   wherein first soldering material is at least one selected from the group consisting of 80Au20Sn, 80Au20Sb, 85Au12Ge, 60Au12Ge, 60Au20Ag20Sn, 75Au25Sb, 60Zn20Ge20Al, 96.4Au3.6Sl and 95An5Al.

* * * * *